(12) United States Patent
Shepard

(10) Patent No.: US 7,813,157 B2
(45) Date of Patent: Oct. 12, 2010

(54) NON-LINEAR CONDUCTOR MEMORY

(75) Inventor: Daniel R. Shepard, North Hampton, NH (US)

(73) Assignee: Contour Semiconductor, Inc., N. Billerica, MA (US)

( * ) Notice: Subject to any disclaimer, the term of this patent is extended or adjusted under 35 U.S.C. 154(b) by 285 days.

(21) Appl. No.: 11/926,778

(22) Filed: Oct. 29, 2007

(65) Prior Publication Data

US 2009/0109726 A1      Apr. 30, 2009

(51) Int. Cl.
*G11C 17/06*      (2006.01)
*G11C 11/00*      (2006.01)
*G11C 17/18*      (2006.01)

(52) U.S. Cl. ............... 365/105; 365/148; 365/163; 365/225.7

(58) Field of Classification Search ............... 365/105, 365/148, 163, 225.7
See application file for complete search history.

(56) References Cited

U.S. PATENT DOCUMENTS

| | | | |
|---|---|---|---|
| 2,709,042 A | 5/1955 | Couffignal | |
| 3,091,754 A | 5/1963 | Nazare | |
| 3,245,051 A | 4/1966 | Robb | |
| 3,308,433 A | 3/1967 | Lochinger | |
| 3,373,406 A | 3/1968 | Cannon et al. | |
| 3,576,549 A | 4/1971 | Hess et al. | |
| 3,626,389 A | 12/1971 | Waaben | |
| 3,701,119 A | 10/1972 | Waaben et al. | |
| 3,721,964 A | 3/1973 | Barrett et al. | |
| 3,806,896 A | 4/1974 | Mar | |
| 3,838,405 A | 9/1974 | Arnett et al. | |
| 3,942,071 A | 3/1976 | Krebs et al. | |
| 4,010,453 A | 3/1977 | Lewis | |
| 4,070,654 A | 1/1978 | Tachi et al. | |
| 4,090,190 A | 5/1978 | Rostkovsky et al. | |
| 4,240,151 A | 12/1980 | Kawagoe et al. | |
| 4,308,595 A | 12/1981 | Houghton | |
| 4,312,046 A | 1/1982 | Taylor | |
| 4,322,822 A | 3/1982 | McPherson | |
| 4,342,102 A | 7/1982 | Puar | |
| 4,347,585 A | 8/1982 | Eardley | |
| 4,385,368 A | 5/1983 | Principi et al. | |
| 4,394,752 A | 7/1983 | Boudon et al. | |
| 4,404,480 A | 9/1983 | Ransom et al. | |

(Continued)

FOREIGN PATENT DOCUMENTS

DE      10111454 A1      9/2002

(Continued)

OTHER PUBLICATIONS

International Search Report and Written Opinion for PCT/US2008/075986, mailed Jan. 22, 2009.

(Continued)

*Primary Examiner*—Ly D Pham
(74) *Attorney, Agent, or Firm*—Goodwin Procter LLP

(57) ABSTRACT

A high-speed, low-power memory device comprises an array of non-linear conductors wherein the storage, address decoding, and output detection are all accomplished with diodes or other non-linear conductors. In various embodiments, the row and column resistors are switchable between a high resistance when connected to a row or column that is non-selected, and a low resistance when connected to the selected row and column.

23 Claims, 5 Drawing Sheets

U.S. PATENT DOCUMENTS

| | | |
|---|---|---|
| 4,419,741 A | 12/1983 | Stewart et al. |
| 4,442,507 A | 4/1984 | Roesner |
| 4,479,200 A | 10/1984 | Sato et al. |
| 4,525,921 A | 7/1985 | Carson et al. |
| 4,534,008 A | 8/1985 | Fuchs et al. |
| 4,554,640 A | 11/1985 | Wong et al. |
| 4,561,070 A | 12/1985 | Armstrong |
| 4,608,672 A | 8/1986 | Roberts et al. |
| 4,646,128 A | 2/1987 | Carson et al. |
| 4,646,266 A | 2/1987 | Ovshinsky et al. |
| 4,661,927 A | 4/1987 | Graebel |
| 4,710,900 A * | 12/1987 | Higuchi ............... 365/185.18 |
| 4,721,885 A | 1/1988 | Brodie |
| 4,757,475 A | 7/1988 | Awaya et al. |
| 4,772,886 A | 9/1988 | Hasegawa et al. |
| 4,782,340 A | 11/1988 | Czubatyj et al. |
| 4,800,529 A | 1/1989 | Ueno et al. |
| 4,845,679 A | 7/1989 | Vu |
| 4,884,238 A | 11/1989 | Lee et al. |
| 4,920,516 A | 4/1990 | Tsuchimoto et al. |
| 5,051,865 A | 9/1991 | Kato et al. |
| 5,163,328 A | 11/1992 | Holland et al. |
| 5,203,731 A | 4/1993 | Zimmerman |
| 5,296,716 A | 3/1994 | Ovshinsky et al. |
| 5,357,471 A | 10/1994 | Alapat |
| 5,390,145 A | 2/1995 | Nakasha et al. |
| 5,397,957 A | 3/1995 | Zimmerman |
| 5,432,729 A | 7/1995 | Carson et al. |
| 5,441,907 A | 8/1995 | Sung et al. |
| 5,463,269 A | 10/1995 | Zimmerman |
| 5,463,583 A * | 10/1995 | Takashina ............. 365/189.06 |
| 5,493,533 A | 2/1996 | Lambrache |
| 5,569,973 A | 10/1996 | Zimmerman |
| 5,576,986 A | 11/1996 | Matsuzaki et al. |
| 5,640,343 A | 6/1997 | Gallagher et al. |
| 5,668,032 A | 9/1997 | Holmberg et al. |
| 5,673,218 A | 9/1997 | Shepard |
| 5,675,531 A | 10/1997 | McClelland et al. |
| 5,719,589 A | 2/1998 | Norman et al. |
| 5,835,396 A | 11/1998 | Zhang |
| 5,837,564 A | 11/1998 | Sandhu et al. |
| 5,840,608 A | 11/1998 | Chang |
| 5,889,694 A | 3/1999 | Shepard |
| 6,055,180 A | 4/2000 | Gudesen et al. |
| 6,075,723 A * | 6/2000 | Naiki et al. ............ 365/185.03 |
| 6,117,720 A | 9/2000 | Harshfield |
| 6,163,475 A | 12/2000 | Proebsting |
| 6,185,122 B1 | 2/2001 | Johnson et al. |
| 6,198,682 B1 | 3/2001 | Proebsting |
| 6,236,587 B1 | 5/2001 | Gudesen et al. |
| 6,256,767 B1 | 7/2001 | Kuekes et al. |
| 6,259,132 B1 | 7/2001 | Pio |
| 6,351,023 B1 | 2/2002 | Gates et al. |
| 6,385,075 B1 | 5/2002 | Taussig et al. |
| 6,459,095 B1 | 10/2002 | Heath et al. |
| 6,462,998 B1 | 10/2002 | Proebsting |
| 6,478,231 B1 | 11/2002 | Taussig |
| 6,552,409 B2 | 4/2003 | Taussig et al. |
| 6,559,468 B1 | 5/2003 | Kuekes et al. |
| 6,567,295 B2 | 5/2003 | Taussig et al. |
| 6,586,327 B2 | 7/2003 | Shepard |
| 6,598,164 B1 | 7/2003 | Shepard |
| 6,613,650 B1 | 9/2003 | Holmberg |
| 6,721,223 B2 | 4/2004 | Matsumoto et al. |
| 6,744,681 B2 * | 6/2004 | Hogan ....................... 365/200 |
| 6,839,260 B2 | 1/2005 | Ishii |
| 6,956,757 B2 | 10/2005 | Shepard |
| 7,054,219 B1 | 5/2006 | Petti et al. |
| 7,088,613 B2 | 8/2006 | Lue et al. |
| 7,149,934 B2 | 12/2006 | Shepard |
| 7,183,206 B2 | 2/2007 | Shepard |
| 7,190,602 B2 | 3/2007 | Johnson et al. |
| 7,330,369 B2 | 2/2008 | Tran |
| 7,376,008 B2 | 5/2008 | Shepard |
| 7,408,798 B2 | 8/2008 | Bernstein et al. |
| 7,460,384 B2 | 12/2008 | Shepard |
| 7,471,547 B2 | 12/2008 | Schloesser |
| 7,548,453 B2 | 6/2009 | Nestler |
| 7,548,454 B2 | 6/2009 | Nestler |
| 7,554,873 B2 | 6/2009 | Lee et al. |
| 7,593,246 B2 | 9/2009 | Shepard |
| 7,593,256 B2 | 9/2009 | Nestler |
| 2002/0126526 A1 | 9/2002 | Taussig et al. |
| 2002/0184459 A1 | 12/2002 | Taussig et al. |
| 2002/0191434 A1 | 12/2002 | Taussing et al. |
| 2002/0192895 A1 | 12/2002 | Taussig et al. |
| 2002/0196659 A1 | 12/2002 | Hurst et al. |
| 2003/0003633 A1 | 1/2003 | Mei et al. |
| 2003/0021176 A1 | 1/2003 | Hogan |
| 2003/0026120 A1 | 2/2003 | Scheuerlein |
| 2003/0028699 A1 | 2/2003 | Holtzman et al. |
| 2004/0145938 A1 | 7/2004 | Tihanyi |
| 2004/0160805 A1 | 8/2004 | Rinerson et al. |
| 2005/0067675 A1 | 3/2005 | Shepard |
| 2005/0127350 A1 | 6/2005 | Furkay et al. |
| 2006/0072427 A1 | 4/2006 | Kanda et al. |
| 2007/0028150 A1 | 2/2007 | Shepard |
| 2007/0242494 A1 | 10/2007 | Nestler |
| 2007/0247890 A1 | 10/2007 | Shepard |
| 2008/0013354 A1 | 1/2008 | Shepard |
| 2008/0016414 A1 | 1/2008 | Shepard |
| 2009/0141535 A1 | 6/2009 | Yang et al. |
| 2009/0161420 A1 | 6/2009 | Shepard |
| 2009/0225579 A1 | 9/2009 | Shepard et al. |
| 2009/0225621 A1 | 9/2009 | Shepard |
| 2009/0296445 A1 | 12/2009 | Shepard |

FOREIGN PATENT DOCUMENTS

| | | |
|---|---|---|
| EP | 0202892 | 11/1986 |
| EP | 0257926 | 3/1988 |
| JP | 57203293 A | 12/1982 |
| JP | 57203294 A | 12/1982 |
| JP | 2098898 A | 4/1990 |
| WO | WO-99/39394 A1 | 8/1999 |

OTHER PUBLICATIONS

Berger, "Models for Contacts to Planar Devices," Solid-State Electronics, vol. 15 (1972), pp. 145-158.

Crawford et al., "An Improved Tunnel Diode Memory System," IBM Journal (Jul. 1963), pp. 199-206.

De Graaf et al., "A Novel High-Density Low-Cost Diode Programmable Read only Memory," IEEE IEDM, session 7.6.1 (1996), pp. 189-192.

Hodges et al., "Analysis and Design of Digital Integrated Circuits," McGraw-Hill Book Company, pp. 27-32.

Hurst, "A Survey of Published Information on Universal Logic Arrays," Microelectronics and Reliability, vol. 16 (1977), pp. 663-674.

International Search Report in International Application No. PCT/US99/02239, mailed May 31, 1999.

International Search Report and Written Opinion in International Patent Application No. PCT/US2007/007792, mailed Oct. 30, 2007 (12 pages).

International Search Report and Written Opinion in International Patent Application No. PCT/US07/011020, mailed Jul. 18, 2008 (14 pages).

International Search Report and Written Opinion in International Patent Application No. PCT/US2008/082503, mailed Feb. 25, 2009 (10 pages).

McConnell et al., "Diode-Transistor Logic," Digital Electronics, Chapter 5, West Virginia Univ. (2002), pp. 1-14.

Near et al., "Read-only Memory Adds to Calculator's Repertoire," Electronics (Feb. 3, 1969), pp. 70-77.

Partial International Search Report in International Patent Application No. PCT/US07/011020, mailed Apr. 14, 2008, 6 pages.

"Summary Page: National Radio Institute 832," Old-Computers.com, ,http://old-computers.com/museum/computer.asp?c=884&st=1., (Apr. 4, 2007) 2 pages.

Wang et al., "High-Current-Density Thin-Film Silcone Diodes Grown at Low Temperature," Applied Phys. Lett., vol. 85(11), pp. 2122-2124 (Sep. 13, 2004).

Wang et al., "Low Temperature Thin-Film Silicon Diodes for Consumer Electronics," Mater. Res. Soc. Symp. Proc., vol. 862 (2005), pp. A15.5.1-A15.5.6.

* cited by examiner

NON-LINEAR CONDUCTOR MEMORY

FIELD OF THE INVENTION

The present invention relates to the design of memory devices and, in particular, to the design of high-performance, low-power memory devices utilizing an array of non-linear conductors.

CROSS-REFERENCE TO RELEVANT PATENTS

This application makes reference to U.S. Pat. No. 5,673, 218 by Shepard titled "Dual-Addressed Rectifier Storage Device," issued Sep. 30, 1997, which is hereby incorporated herein by reference in its entirety.

BACKGROUND OF THE INVENTION

Diode-based information-processing devices have existed for more than half a century and many forms of diode-decoded devices have been disclosed in the prior art. See, e.g., U.S. Pat. Nos. 2,686,299; 2,872,664; and 4,661,927. These prior-art approaches have both advantages and limitations.

SUMMARY OF THE INVENTION

In accordance with embodiments of the present invention, a low-power diode memory device comprises an array of non-linear conductors (e.g., diodes). The storage, address decoding, and output detection are all accomplished with diodes or other non-linear conductors, and the device can operate at high speed while consuming low power. By decoding and selecting a single row and column within the storage array (or within a tiled sub-region of the array), it is possible to place a desired voltage (or voltage range) across a storage bit within that storage array (or tiled sub-region) for reading or writing.

Accordingly, in a first aspect, the invention features an electronic memory device including information circuitry for storing and facilitating retrieval of information, row and column switches, and selection circuitry for reading or writing to the information circuitry by selecting a row and column switch. The information circuitry includes two overlapping pluralities of generally parallel conductors, storage locations at each point of overlap, and nonlinear conductive devices disposed at least at some of the storage locations.

Embodiments of the invention may include one or more of the following features. The selection circuitry for selecting one of the row switches may include circuitry for increasing the impedance of the non-selected row switches relative to that of the selected row switch. The circuitry for increasing the impedance of the non-selected row switches may include a first array of nonlinear conductive elements connected to the row switches. Each nonlinear conductive element in the first array may include a diode. The selection circuitry for selecting one of the column switches may include circuitry for increasing the impedance of the non-selected column switches relative to that of the selected column switch. The circuitry for increasing the impedance of the non-selected column switches may include a second array of nonlinear conductive elements connected to the column switches. Each nonlinear conductive element in the second array may include a diode.

In an embodiment, each row switch and/or column switch includes or consists essentially of an enhancement-mode NMOS transistor. At least one of the nonlinear conductive devices may be connected to the first and second pluralities of generally parallel conductors at approximately a point of overlap of the two pluralities. Each of the nonlinear conductive devices may include a diode, a fuse, an antifuse, or a phase-change material.

Some embodiments of the invention include row decoder circuitry between the row switches and the first plurality of generally parallel conductors, as well as column decoder circuitry between the column switches and the second plurality of generally parallel conductors. The row decoder circuitry may include a third array of nonlinear conductive elements, each of which may include a diode. The column decoder circuitry may include a fourth array of nonlinear conductive elements, each of which may include a diode.

In a second aspect, the invention features a method including providing an electronic memory device which includes a grid of memory locations and selection circuitry therefor. The grid includes a plurality of rows and row switches associated therewith, as well as a plurality of columns and column switches associated therewith A pre-charge voltage is applied to the row and column switches. A row switch is selected by discharging the pre-charge voltage on all but the selected row switch, and a column switch is selected by discharging the pre-charge voltage on all but the selected column switch. A row voltage is applied to the row switches, thereby increasing the voltage on the selected row connected to the selected row switch. A column voltage is applied to the column switches, thereby decreasing the voltage on the selected column connected to the selected column switch.

In an embodiment, application of the row and column voltages changes the state of the nonlinear conductive device located at the memory location proximate the intersection of the selected row and the selected column. In another embodiment, application of the row and column voltages outputs the state of the nonlinear conductive device located at the memory location proximate the intersection of the selected row and the selected column.

DESCRIPTION OF THE PREFERRED EMBODIMENT

Figure 1:
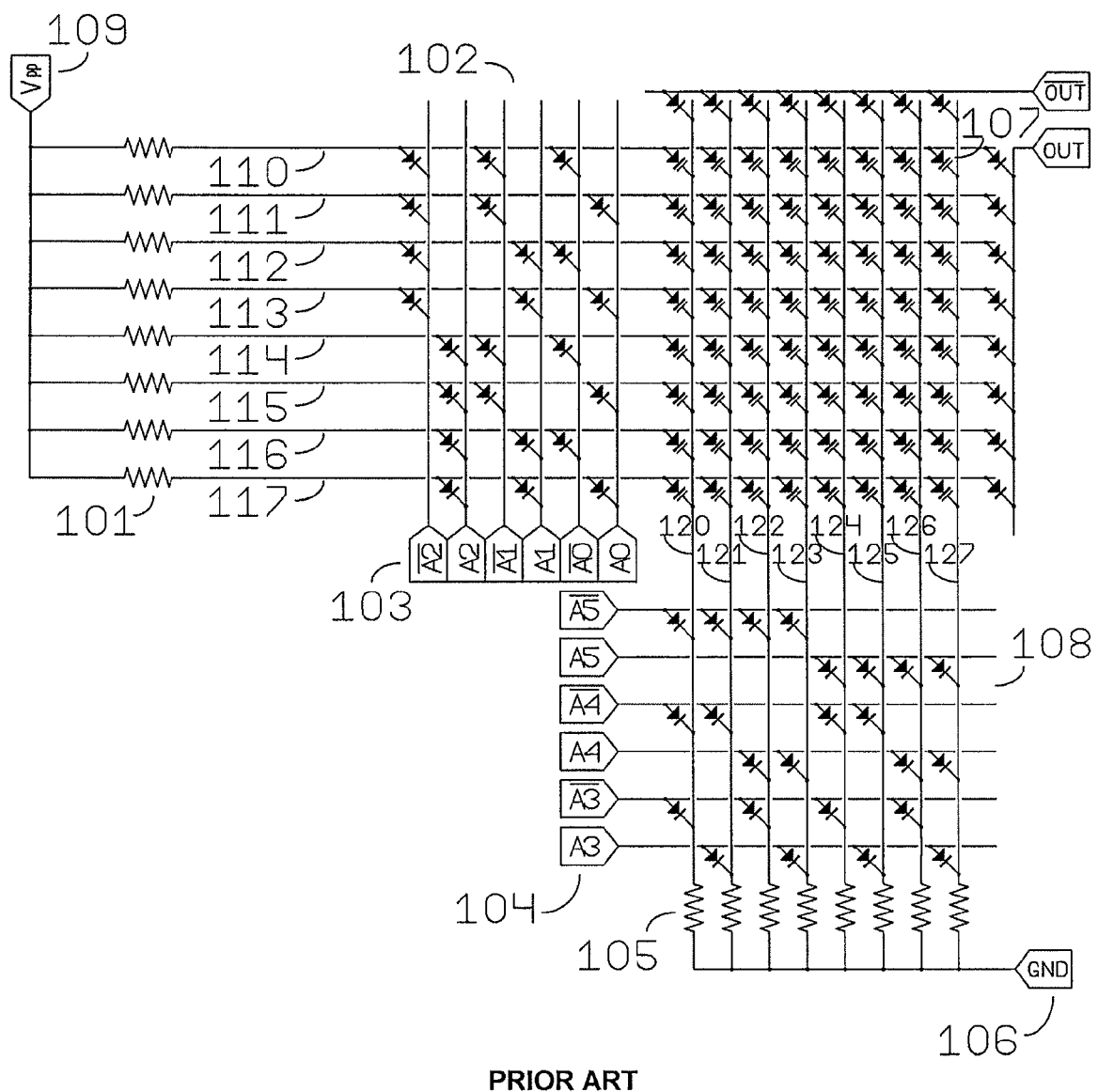
FIG. 1 schematically illustrates a prior-art dual-addressed rectifier storage device.

A device in accordance with U.S. Pat. No. 5,673,218 is shown in FIG. 1. In that patent, power 109, in the form of $V_{PP}$, is applied to row lines 110-117 through resistors 101, and that power is diverted away from all but one row line by diode decoder 102 when complementary address input bits 103 are applied. Complementary address input bits 103 are applied as low-voltage signals (typically, zero volts or "Ground") on one of each row address signal pair inputs (here A0 through A2 and their complements). Specifically, for row lines 110-117, an address is applied to row-address inputs 103. If the row address to be applied is "000" then a zero-volt signal is applied to A0, A1 and A2 while $\overline{A0}$, $\overline{A1}$, and $\overline{A2}$ are left floating (e.g., floating or connected to a high impedance or a high voltage near or above $V_{PP}$). When these inputs are applied through diode row-address decoder 102, A0 causes rows 111, 113, 115, and 117 to be pulled low (to within one diode forward voltage drop of Ground), A1 causes rows 112, 113, 116, and 117 to be pulled low, and A2 causes rows 114-117 to be pulled low. Only selected row 110 remains at the applied high voltage $V_{PP}$. Furthermore, complementary input bits are applied as high-voltage signals on one of each column-address signal-pair inputs (here A3 through A5 and their complements). Specifically, for column lines 120-127, an address is applied to column-address inputs 104. If the column address to be applied is "000" then a higher voltage signal (for example, about 3 volts) is applied to $\overline{A3}$, $\overline{A4}$, and $\overline{A5}$, while A3, A4 and A5 are left low (e.g., floating or connected to a high impedance or to a voltage at or near Ground). When these inputs are applied through diode column-address decoder 108, $\overline{A3}$ causes columns 122, 124, 126, and 128 to be forced high (to within one diode forward-voltage drop of the column-address input voltage), $\overline{A4}$ causes columns 120, 121, 124, 125 to be forced high, and $\overline{A5}$ causes columns 120-123 to be forced high. Only column 127 remains selected at the applied low-voltage input 106 of Ground supplied through one of resistors 105. This approach carries a tradeoff between operating speed and power. For high-speed operation, resistors 101 and 105 should be small so that the parasitic capacitances of the diode storage matrix 107 will not cause operation to be slower than desired (since operation speed is a function of the RC time constant of those resistors and the parasitic capacitances of the diodes and the array, among other things). But, for low power consumption, the resistors 101, 105 should be large so that power loss is minimized when the row decoder 102 pulls the non-selected rows low and the column decoder 108 forces the non-selected columns high. A feature of embodiments of the present invention is improvement upon this tradeoff by making these resistors 101, 105 effectively switchable between a high resistance when connected to a row or column that is non-selected and a low resistance when connected to a selected row or column.

Figure 2:
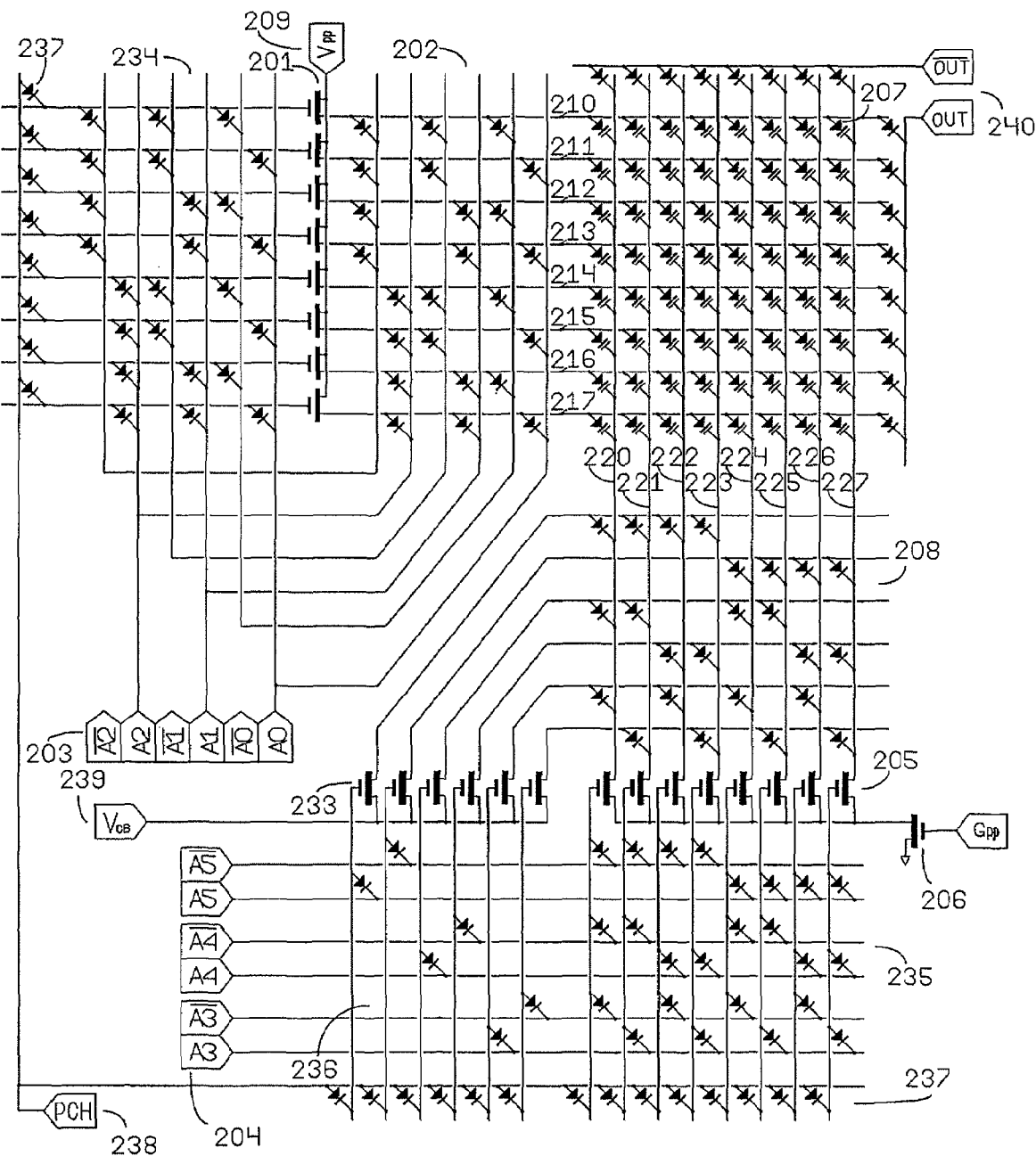
FIG. 2 schematically illustrates a diode-decoded storage device in accordance with an embodiment of the invention.
Figure 4:
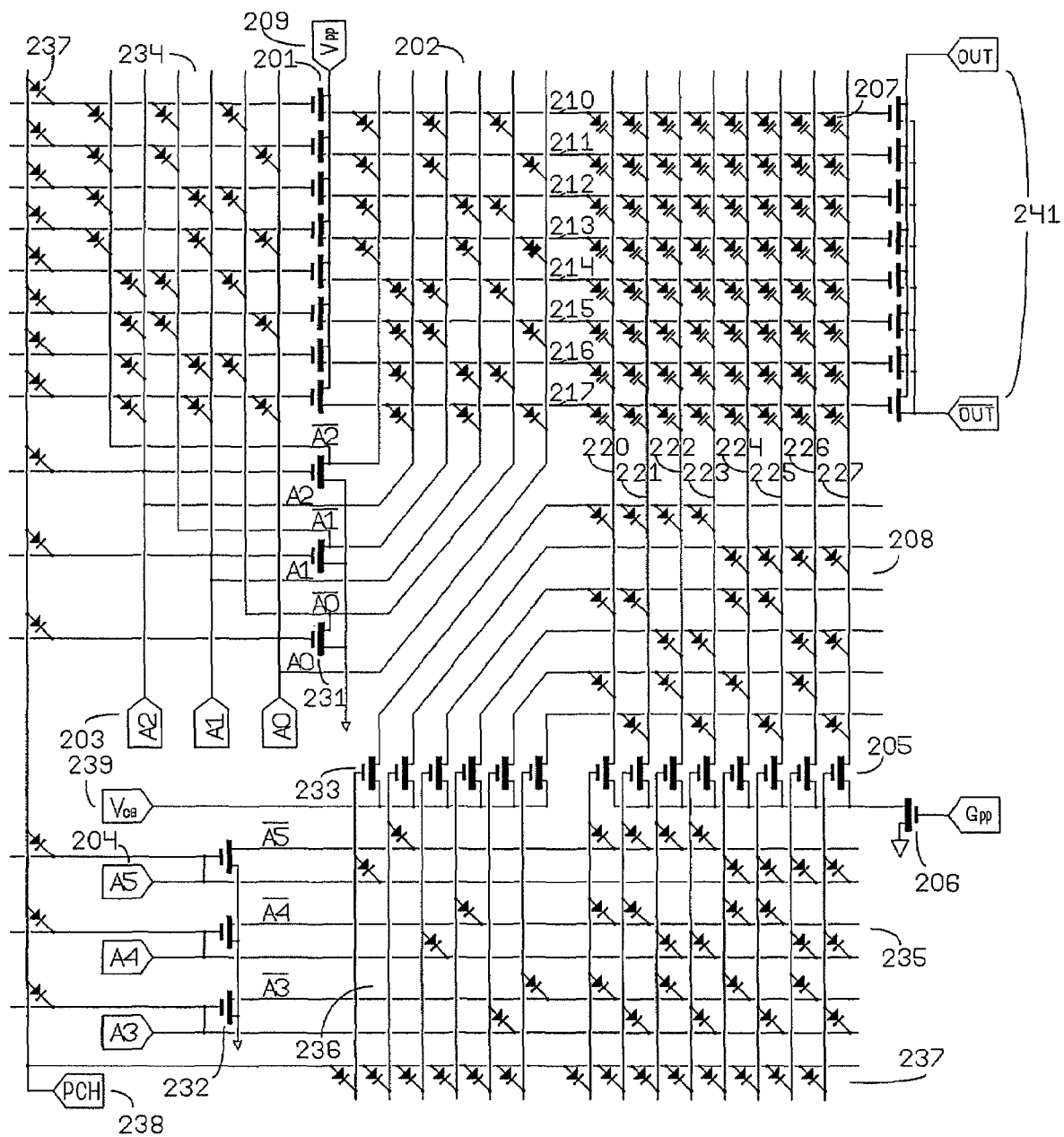
FIG. 4 schematically illustrates a simplified variation of a diode-decoded storage device in accordance with an embodiment of the invention.

FIG. 2 shows a simplified schematic of an embodiment of the present invention. Through the introduction of switches 201, 205, the above-mentioned tradeoff between speed and power can be controlled. In an embodiment, switches 201, 205 include or consist essentially of enhancement-mode NMOS transistors. As such, the terms "switch" and "transistor" are utilized interchangeably herein in reference to switches 201, 205, and 233. In various embodiments, other switching devices, such as bipolar, depletion-mode, and/or PMOS transistors, may be utilized. In some embodiments, all transistors in the circuit are of the same type to facilitate manufacturing and to decrease complexity and cost, while in other embodiments, two or more different types of switching devices are included. In addition, other functionality, such as the generation of complementary row-address inputs (e.g., with transistors 231 as shown in FIG. 4) and the generation of complementary column-address inputs (e.g., with transistors 232 as shown in FIG. 4), may be added. In an exemplary embodiment, all of the transistor gates are turned on at once by pre-charging the gates of the transistors through pre-charge diodes 237 by applying a positive pre-charge voltage at the pre-charge (PCH) input 238. This PCH input voltage is preferably high enough to switch on the transistors, allowing for the forward voltage drop of pre-charge diodes 237 and threshold voltages of the transistors, if any. Switches 201, along with diode decoder 234, are analogous to resistors 101 in FIG. 1. Likewise, switches 205, along with diode decoder 235, are analogous to resistors 105 in FIG. 1.

The operation of diode decoders 234 and 235 is similar to the operation of those described with reference to FIG. 1 (i.e., diode row-address decoder 102 and diode column-address decoder 108). The gates of transistors 201 are pre-charged to a voltage (one that will enable array voltage $V_{PP}$ 209 to be passed through transistors 201 to the storage array), and then all but one of those transistor gates are discharged to ground through diode decoder 234 as a function of row-address inputs 203 applied to A0-A2 and $\overline{A0}$, $\overline{A1}$, and $\overline{A2}$. When the gate of one of transistors 201 is discharged (as all but one will be during normal operation), that transistor acts like a very high-resistance resistor (i.e., it is shut off) supplying $V_{PP}$ to its corresponding row line. The one remaining transistor having its gate charged will act like a very low-resistance resistor supplying $V_{PP}$ to its selected row line. The row-address diode decoder 202 operates just as row-address diode decoder 102 does in FIG. 1. The diodes in internal row-address decoder 202 act as clamps against rising voltages and work in complementary fashion with the transistor to each row: the transistor is available to drive the row voltage high and the diodes are available to pull the row voltage low.

For the columns of the storage array, the gates of transistors 205 are pre-charged to a voltage that will enable voltage on the columns in the array to be passed through those transistors 205 through transistor 206 to ground when $G_{PP}$ has a high turn-on voltage applied, and then all but one of those transistor gates are discharged to ground through diode decoder 235 as a function of column-address inputs 204 applied to A3-A5 and $\overline{A3}$-$\overline{A5}$. If the gate of one of transistors 205 is discharged (as all but one will be during normal operation), that transistor acts like a very high-resistance resistor supplying ground to its corresponding column line. The one remaining transistor having its gate charged will act like a very low-resistance resistor supplying ground to its selected column line. The column-address diode decoder 235 operates just as column address diode decoder 108 does in FIG. 1. The diodes in internal column address decoder 208 act as clamps against falling voltages and work in complementary fashion with the transistor to each column: the transistor is available to pull the column voltage low and the diodes are available to clamp the column voltage high. To provide the internal column decoder with the complementary address-pair high voltages, transistors 233 act as voltage inverters to low-going address lines A3-A5 and $\overline{A3}$-$\overline{A5}$; specifically, the gates of transistors 233 are pre-charged through diodes 237 (as are all other transistor gates) and then are selectively discharged through the diode selector 236 to provide the high-voltage complementary address pairs (as is done on address inputs 104 in FIG. 1) to internal column address decoder 208.

Figure 3:
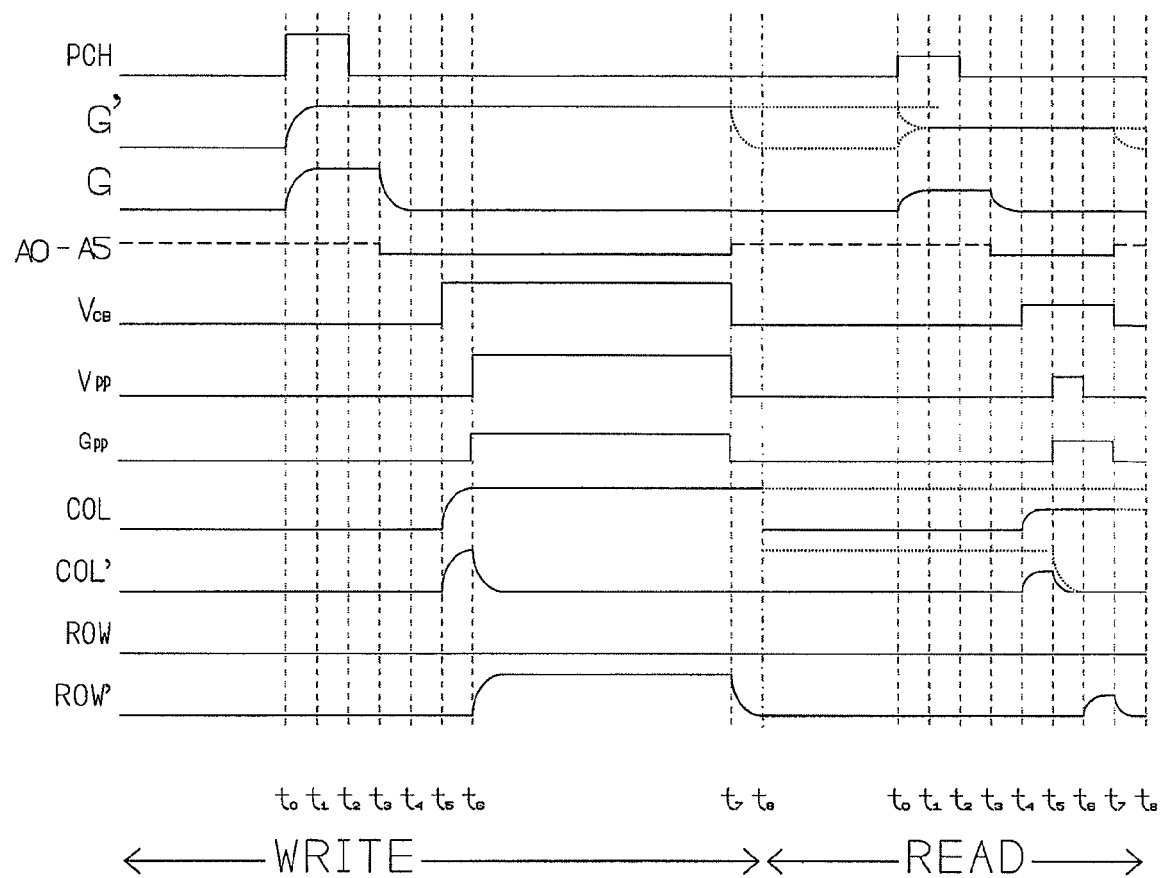
FIG. 3 is a timing diagram of the diode-decoded storage device in accordance with an embodiment of the invention.

The timing diagram shown in FIG. 3 illustrates the sequence of operation for both reading and writing the array according to one embodiment of the invention. In this figure, the time durations and signal heights are for illustration only and are not to scale. Referring to both FIGS. 2 and 3, a write cycle begins at time $t_0$ with the application of high-voltage PCH at input PCH 238. This causes the gates (G and G') of transistors to be charged (where G' is the voltage on the gates of transistors to drive the selected row and the selected column). The voltage on the gates rises until time $t_1$ and has fully settled by $t_2$, at which point the PCH voltage is removed. In an embodiment of the invention, the interval $t_1 \rightarrow t_2$ is approximately zero seconds. At time $t_3$, the address inputs are applied to row-address inputs 203 and column-address inputs 204. These inputs are only low- (e.g., ground-) going inputs and may, for example, be driven by open collector or single-sided MOS driver circuits. Row-address signals A0-A2 and complementary row-address signals $\overline{A0}$-$\overline{A2}$ discharge the gates to transistors 201 through diode decoder 234. By time $t_4$, the voltage G on non-selected gates of transistors 201 is discharged. At the same time, column address signals A3-A5 and complementary column address signals $\overline{A3}$-$\overline{A5}$ discharge the gates to transistors 205 through diode decoder 235. By time $t_4$, the voltage G on non-selected gates of transistors 205 is discharged.

By time $t_5$, the charge on the gates of all transistors has settled and the low voltages to the rows have been established by means of diode clamping through diode row decoder 202. At time $t_5$, the column bias voltage $V_{CB}$ is applied to input 239 and high voltages to the columns are established by diode clamping through diode column decoder 208 (note COL and COL' at interval $t_5 \rightarrow t_6$). This voltage is selected to bias the non-selected columns in storage array 207 such that the voltage across the diodes connecting the selected row (once $V_{PP}$ is applied) and the non-selected columns is at zero volts or lower (i.e., the diodes are reverse-biased). In an embodiment of the invention, column bias voltage $V_{CB}$ is approximately equal to $V_{PP}$. In an embodiment of the invention, column bias voltage $V_{CB}$ is approximately equal to $V_{PP}$ plus one forward voltage drop of a diode, $V_f$ (i.e., $V_{PP}$ is $V_f$ greater than $V_{CB}$). By time $t_6$, one row transistor and one column transistor will be switched on; the non-selected columns will be biased to a high voltage and the non-selected rows will be biased to a low voltage.

During a write cycle, at time $t_6$, the programming voltages $V_{PP}$ and $G_{PP}$ are applied and held until time $t_7$. $V_{PP}$ will cause the selected row (ROW') to be driven high and $G_{PP}$ will cause the selected column (COL') to be pulled low. The duration of the interval $t_6 \rightarrow t_7$ is determined by the time needed to change the state of the programmable material in series with the diodes of the storage array 207. In an embodiment, the programmable material is an antifuse, e.g., a 20 Angstrom (Å) $SiO_2$ antifuse that can change states in approximately 1 to 2 microseconds at a $V_{PP}$ programming voltage of greater than approximately 6 volts. In other embodiments, the programmable material includes at least one of a fuse, a phase-change material such as a chalcogenide, or other materials that (i) change resistivity as a function of the current passed therethrough, (ii) change resistivity as a function of the voltage placed thereacross, or (iii) change resistivity as a function of the temperature applied thereto. At time t8, the write cycle is complete. The read cycle timing is very similar to the write cycle except that the voltages PCH, $V_{CB}$, and $V_{PP}$ are lower and the time interval $t_6 \rightarrow t_7$ may be much shorter (merely long enough for the row and column voltages to settle and be sensed at the output or outputs 240; in an embodiment, the time interval is less than approximately 1 microsecond) and the output is sensed at time $t_7$ after removing $V_{PP}$ and just prior to removing voltage inputs $V_{CB}$ and $G_{PP}$. In an embodiment of the invention, voltage input $G_{PP}$ is applied approximately as $V_{PP}$ is removed; in this way, the selected row is charged up to approximately $V_{PP}$ and $V_{PP}$ is removed. Then, if a nonlinear element (e.g., a diode) is present at the addressed location, the row is discharged to ground when $G_{PP}$ is applied (if no connection via a nonlinear element is present at the addressed location, the row remains charged up to approximately $V_{PP}$).

To minimize power consumption, as is indicated in FIG. 3 by the dim traces for COL, COL' and G', the columns and gates of the selected transistors can be left charged between read and write cycles. Also, the address inputs may be either asserted low or are high-impedance. This is an advantage for the address inputs because, to fully turn on the transistors 201, 205 to drive the row lines and the column lines, respectively, the voltage needed on the transistor gates is a function of the voltages on the sources and drains of those transistors (which varies depending upon whether the device is being read or written). A controller or control logic to this device which can switch the voltage level on $V_{PP}$ is present in one embodiment of the invention. This capability may add complexity to that signal's circuitry, but the address bits' signal circuitry can be made the same for both modes of operation.

It should be noted that the exemplary embodiment of the invention shows address decoding and line selection being made for both the row lines and the column lines with output detection being made with complementary outputs from the array. One output signal is generated on a single conductor that is connected to every row line by a non-linear conductor (e.g., a diode), and the other output signal is generated on a single conductor that is connected to every column line by a non-linear conductor (e.g., a diode). Variations on this output embodiment include implementing only the row-connected output without the column-connected output (or vice versa), whereby the voltage level on the selected line (or the current that can be drawn by virtue of the voltage level on the selected line) is detected. Other variations on this output embodiment include address decoding and line selection along one dimension of the array, whereby data bit information is available in parallel on another plane of the array upon which data bit bit-address decoding and selection is performed.

In another embodiment, shown in FIG. 4, the output circuit 241 connects each row to the gate of a field-effect transistor ("FET"). The sources of these output FETs connected to each row may be wired together, the drains may be wired together, and these parallel row output transistors may be biased such that if one row is at a higher voltage, that row's FET is switched on. In this variation, $V_{PP}$ is preferably turned off prior to reading, as the $V_{PP}$ signal would resist being pulled low by the selected column if a diode connection were present. With $V_{PP}$ turned off, the voltage on the selected row line will be pulled down by a diode connected to the selected column. FIG. 4 also shows complementary address generation where the gates of transistors 231, 232 are pre-charged by diodes 237 and selectively discharged when address inputs 203, 204 are applied.

Figure 5:
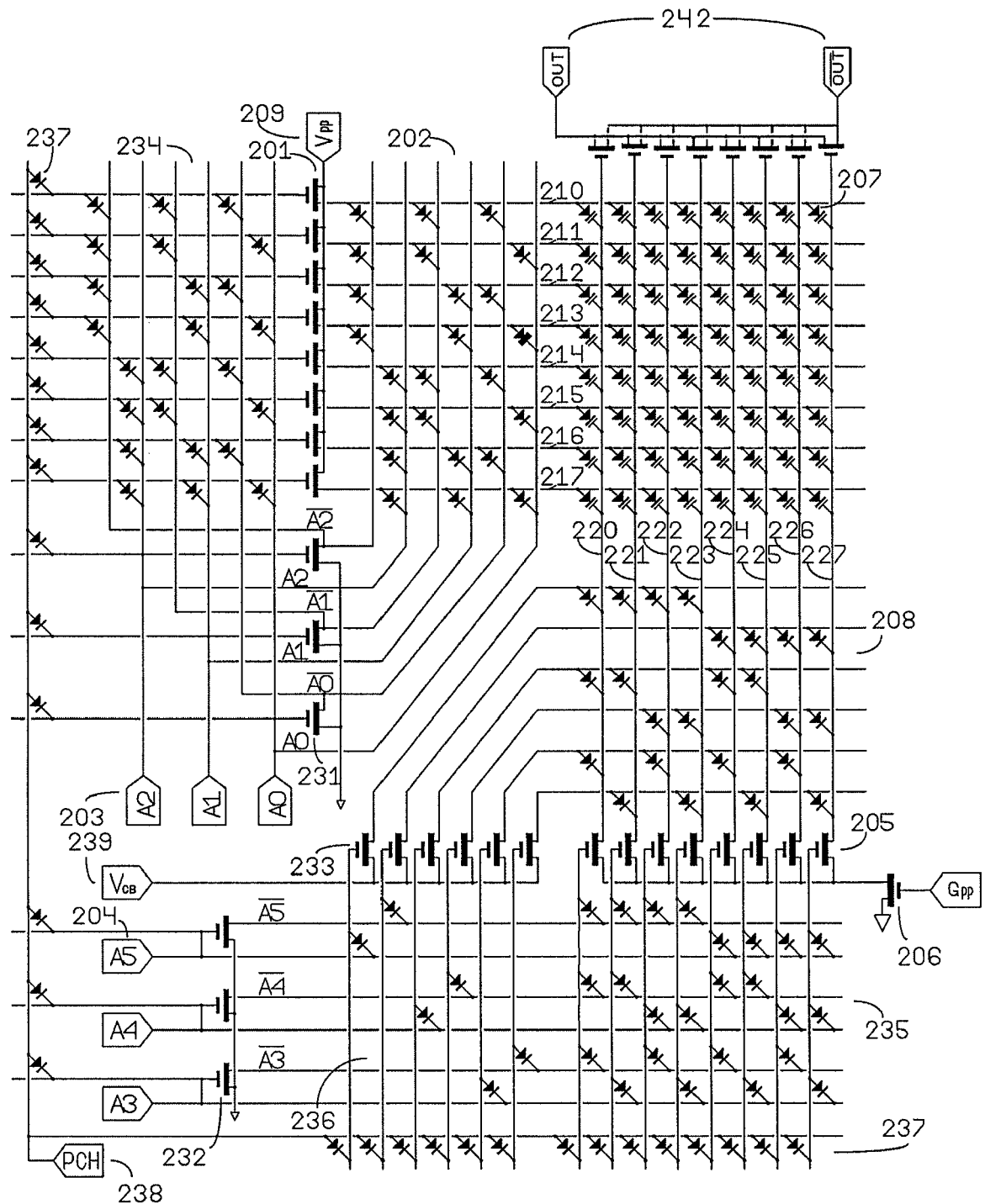
FIG. 5 schematically illustrates a simplified variation on the output circuitry of a diode-decoded storage device in accordance with an embodiment of the invention.

In yet another embodiment, shown in FIG. 5, the output circuit 242 is utilized. The ground signal to the columns is turned off, thereby allowing the selected column to be pulled high if a nonlinear element (e.g., a diode) is connected to the selected column line from the selected row line (typically, $V_{PP}$ would be continuously applied but could be switched off, in which case the charge balancing, if any, between the selected column and selected row would be measured). It should be noted that by putting the output FETs on the row lines, the selected column may be retained when $V_{PP}$ is turned off, thereby enabling a new row line to be selected without selecting a new column line (separate pre-charge input paths are preferred for the row lines and the column lines). Conversely, by putting the output FETs on the column lines, the selected row can be retained when Ground is turned off, thereby enabling a new column line to be selected without selecting a new row line. As will be clear to one skilled in the art, with the output FETs on the rows, each FET's source and drain may be biased to switch on when its gate is at a high voltage and off when the gate are at a low voltage; with only one row high (enabled) at a time, only one row FET may be switched on at a time. With the output FETs on the columns, depletion-mode FETs are preferably used for the output transistors, each FET's source and drain may be biased to switch off when its gate is at a high voltage and on when its gate is at a low voltage; with only one column low (enabled) at a time, only one column FET may be switched on at a time. These two output variations may be used together by switching off both $V_{PP}$ and Ground.

In another embodiment of this invention, either or both of the internal row decoders 202 and column decoders 208 of FIG. 2, 4, or 5 are excluded. This is because the switches 201, 205 are sufficient to select one row and one column of the array while keeping the remaining rows and columns in a high-impedance state. When removing the internal row and column decoders, $V_{CB}$ can be turned off at time $t_6$ (as it could be even when the internal decoders are present) to conserve power (i.e., prevent power consumption by leakage). However, internal row and column decoders may be preferred because they guard against leakage currents from the switches 201, 205. The internal row and column decoders also guard against bad bits in the storage array that leak currents that could energize rows and columns other than the selected row and column. To maximally protect against such a fault, multiple internal row and column decoders can be incorporated. These decoders may be present on either or both sides of the array; the top and/or bottom of the array; or even within the area of the array. $V_{CB}$ may be turned off at time $t_7$ to guard against this type of bad-bit fault.

In another embodiment, the transistors are present in a layer other than the layer comprising the storage array. Embodiments of the present invention find applicability in memory devices implemented in a three-dimensional (3-D) configuration, for example, as is disclosed in U.S. Pat. No. 6,956,757, the entire disclosure of which is hereby incorporated by reference. In yet another embodiment, the switching devices include or consist essentially of devices other than enhancement-mode NMOS transistors, e.g., NMOS, PMOS, bi-polar, enhancement-mode, depletion-mode, BJT, JFET, MOSFET, FET, thin-film, TFT, SCR, UJT, triac, vacuum tube, gated field emitter, and/or MEMS-based switching devices.

Embodiments of the present invention find applicability in memory devices comprising an array of multiple sub-arrays whereby the device is tiled into many sub-arrays. One or more of these sub-arrays is accessed at the same time for reading or writing multiple bits of information; fewer than all of the sub-arrays may be accessed at one time to conserve power. Embodiments of the present invention also find applicability in memory devices comprising an array of multiple sub-arrays whereby the device is tiled into many sub-arrays for other purposes. These memory devices may be designed and produced using well known techniques including the use of CAD and CAM tools, photolithographic processing, topography based lithographic processing, inkjet-printed or organic semiconductor processing, and/or MEMS processing, among others.

The approach of the present invention may be applied to memory devices and systems for storing digital text, digital books, digital music, digital audio, digital photographs (wherein one or more digital still images can be stored including sequences of digital images), digital video, digital cartography (wherein one or more digital maps can be stored), and any other digital or digitized information as well as any combinations thereof. Devices incorporating embodiments of the invention may be embedded or removable, and may be interchangeable among other devices that can access the data therein. Embodiments of the invention may be packaged in any variety of industry-standard form factor, including Compact Flash, Secure Digital, MultiMedia Cards, PCMCIA Cards, Memory Stick, any of a large variety of integrated circuit packages including Ball Grid Arrays, Dual In-Line Packages (DIPs), SOICs, PLCC, TQFPs and the like, as well as in proprietary form factors and custom designed packages. These packages can contain just the memory chip, multiple memory chips, one or more memory chips along with other logic devices or other storage devices such as PLDs, PLAs, micro-controllers, microprocessors, controller chips or chipsets or other custom or standard circuitry.

The foregoing description of an example of the preferred embodiment of the invention and the variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description, but rather by any claims appended hereto.

What is claimed is:

1. An electronic memory device comprising:
   a. information circuitry for storing and facilitating retrieval of information comprising:
      i. a first plurality of generally parallel conductors,
      ii. a second plurality of generally parallel conductors overlapping the first plurality of generally parallel conductors,
      iii. a plurality of storage locations each disposed proximate to a point of overlap between the first and second pluralities of generally parallel conductors, and
      iv. a plurality of nonlinear conductive devices each disposed at a storage location;
   b. a plurality of row switches each connected to one of the first plurality of generally parallel conductors;
   c. a plurality of column switches each connected to one of the second plurality of generally parallel conductors; and
   d. selection circuitry for selecting one of the plurality of row switches and one of the plurality of column switches in order to read from or write to the information circuitry,
   wherein the selection circuitry for selecting one of the plurality of row switches comprises circuitry, which comprises a first array of nonlinear conductive elements connected to the plurality of row switches, for increasing the impedance of the non-selected row switches relative to the impedance of the selected row switch.

2. The electronic memory device of claim 1, wherein each nonlinear conductive element in the first array comprises a diode.

3. The electronic memory device of claim 1, wherein the selection circuitry for selecting one of the plurality of column switches comprises circuitry for causing the impedance of the non-selected column switches to be greater than the impedance of the selected column switch.

4. The electronic memory device of claim 3, wherein the circuitry for increasing the impedance of the non-selected column switches relative to the impedance of the selected column switch comprises a second array of nonlinear conductive elements connected to the plurality of column switches.

5. The electronic memory device of claim 4, wherein each nonlinear conductive element in the second array comprises a diode.

6. The electronic memory device of claim 1, wherein each of the plurality of row switches comprises an enhancement-mode transistor, an enhancement-mode NMOS transistor, a depletion-mode transistor, a PMOS transistor, or a bipolar transistor.

7. The electronic memory device of claim 6, wherein each of the plurality of row switches consists essentially of an enhancement-mode transistor, an enhancement-mode NMOS transistor, a depletion-mode transistor, a PMOS transistor, or a bipolar transistor.

8. The electronic memory device of claim 1, wherein each of the plurality of column switches comprises an enhancement-mode transistor, an enhancement-mode NMOS transistor, a depletion-mode transistor, a PMOS transistor, or a bipolar transistor.

9. The electronic memory device of claim 8, wherein each of the plurality of column switches consists essentially of an enhancement-mode transistor, an enhancement-mode NMOS transistor, a depletion-mode transistor, a PMOS transistor, or a bipolar transistor.

10. The electronic memory device of claim 1, wherein at least one of the plurality of nonlinear conductive devices is connected to the first and second pluralities of generally parallel conductors at approximately a point of overlap thereof.

11. The electronic memory device of claim 1, wherein each of the plurality of nonlinear conductive devices comprises at least one of a diode, a fuse, an antifuse, a phase-change material, a resistance-change material, or a chalcogenide material.

12. An electronic memory device comprising:
 a. information circuitry for storing and facilitating retrieval of information comprising:
  i. a first plurality of generally parallel conductors,
  ii. a second plurality of generally parallel conductors overlapping the first plurality of generally parallel conductors,
  iii. a plurality of storage locations each disposed proximate to a point of overlap between the first and second pluralities of generally parallel conductors, and
  iv. a plurality of nonlinear conductive devices each disposed at a storage location;
 b. a plurality of row switches each connected to one of the first plurality of generally parallel conductors;
 c. a plurality of column switches each connected to one of the second plurality of generally parallel conductors;
 d. selection circuitry for selecting one of the plurality of row switches and one of the plurality of column switches in order to read from or write to the information circuitry;
 e. row decoder circuitry disposed between the plurality of row switches and the first plurality of generally parallel conductors; and
 f. column decoder circuitry disposed between the plurality of column switches and the second plurality of generally parallel conductors.

13. The electronic memory device of claim 12, wherein the row decoder circuitry comprises a third array of nonlinear conductive elements.

14. The electronic memory device of claim 13, wherein each of the third array of nonlinear conductive elements comprises a diode.

15. The electronic memory device of claim 12, wherein the column decoder circuitry comprises a fourth array of nonlinear conductive elements.

16. The electronic memory device of claim 15, wherein each of the fourth array of nonlinear conductive elements comprises a diode.

17. The electronic memory device of claim 1, wherein at least one of the plurality of row switches or at least one of the plurality of column switches comprises a transistor.

18. The electronic memory device of claim 17, wherein the transistor is selected from the group consisting of BJT, JFET, MOSFET, FET, TFT, SCR, UJT, triac, vacuum tube, gated field emitter, and MEMS switching devices.

19. A method comprising the steps of:
 providing an electronic memory device comprising a grid of memory locations and selection circuitry therefor, the grid comprising a plurality of rows and row switches associated therewith, and a plurality of columns and column switches associated therewith;
 applying a pre-charge voltage to the plurality of row switches and the plurality of column switches;
 selecting one of the plurality of row switches by discharging the pre-charge voltage on all but the selected row switch;
 selecting one of the plurality of column switches by discharging the pre-charge voltage on all but the selected column switch;
 applying a row voltage to the plurality of row switches, thereby increasing a voltage on a selected row connected to the selected row switch; and
 applying a column voltage to the plurality of column switches, thereby decreasing a voltage on a selected column connected to the selected column switch.

20. The method of claim 19, wherein a nonlinear conductive device is disposed at the memory location proximate the intersection of the selected row and the selected column, and the step of applying the row voltage and column voltage changes a state of the nonlinear conductive device.

21. The method of claim 19, wherein a nonlinear conductive device is disposed at the memory location proximate the intersection of the selected row and the selected column, and the step of applying the row voltage and column voltage outputs a state of the nonlinear conductive device.

22. The electronic memory device of claim 1, wherein the plurality of storage locations is disposed in a first layer and each of the pluralities of row and column switches are disposed in a layer different from the first layer.

23. The electronic memory device of claim 1, wherein the plurality of row switches, the plurality of column switches, and the plurality of storage locations are disposed in a three-dimensional configuration.

* * * * *